United States Patent
Shan et al.

(10) Patent No.: US 8,853,991 B2
(45) Date of Patent: Oct. 7, 2014

(54) PHASE ANGLE DETECTION IN AN INVERTER

(75) Inventors: Mingwei Shan, Louisville, KY (US); William Hull Bicknell, Louisville, KY (US); Eric K. Watson, Crestwood, KY (US); Richard D. Suel, II, Louisville, KY (US)

(73) Assignee: General Electric Company, Schenectady, NY (US)

( * ) Notice: Subject to any disclaimer, the term of this patent is extended or adjusted under 35 U.S.C. 154(b) by 304 days.

(21) Appl. No.: 13/362,651

(22) Filed: Jan. 31, 2012

(65) Prior Publication Data

US 2013/0194851 A1 Aug. 1, 2013

(51) Int. Cl.
  *H02P 1/24* (2006.01)
  *H02P 3/18* (2006.01)

(52) U.S. Cl.
  USPC .......................... 318/809; 318/729; 318/812

(58) Field of Classification Search
  CPC ......... H02P 27/16; H02P 27/06; H02P 27/02;
    H02P 23/0081; H02P 27/08; H02P 25/04;
    H02P 2207/01; H02P 27/04; H02P 21/0035;
    H02P 7/29; H02P 25/06; H02P 6/006; H02P
    6/16; Y02T 10/643; B60L 15/025; B66C
    13/26; B66C 2700/081; H02M 7/53875
  USPC ......... 318/812, 815, 808, 810, 811, 599, 135,
    318/729, 438
  See application file for complete search history.

(56) References Cited

U.S. PATENT DOCUMENTS

| | | | | |
|---|---|---|---|---|
| 4,469,998 A | * | 9/1984 | Nola | 318/729 |
| 5,248,866 A | * | 9/1993 | Tanaka et al. | 219/624 |
| 6,636,011 B2 | * | 10/2003 | Sadasivam et al. | 318/727 |
| 7,272,302 B2 | * | 9/2007 | Woodward et al. | 388/801 |
| 2010/0213886 A1 | * | 8/2010 | Cheng et al. | 318/812 |

FOREIGN PATENT DOCUMENTS

JP   5003698   1/1993

* cited by examiner

*Primary Examiner* — Bentsu Ro
*Assistant Examiner* — Zemenay Truneh
(74) *Attorney, Agent, or Firm* — Dority & Manning, P.A.

(57) ABSTRACT

A system and method of detecting phase angle in an inverter is provided. A shunt resistor is coupled to a controller which is part of an inverter circuit and a phase angle may be directly derived from the detected voltage across the shunt resistor. The detected shunt voltage may be used to adjust the power delivery from the inverter to the load.

20 Claims, 7 Drawing Sheets

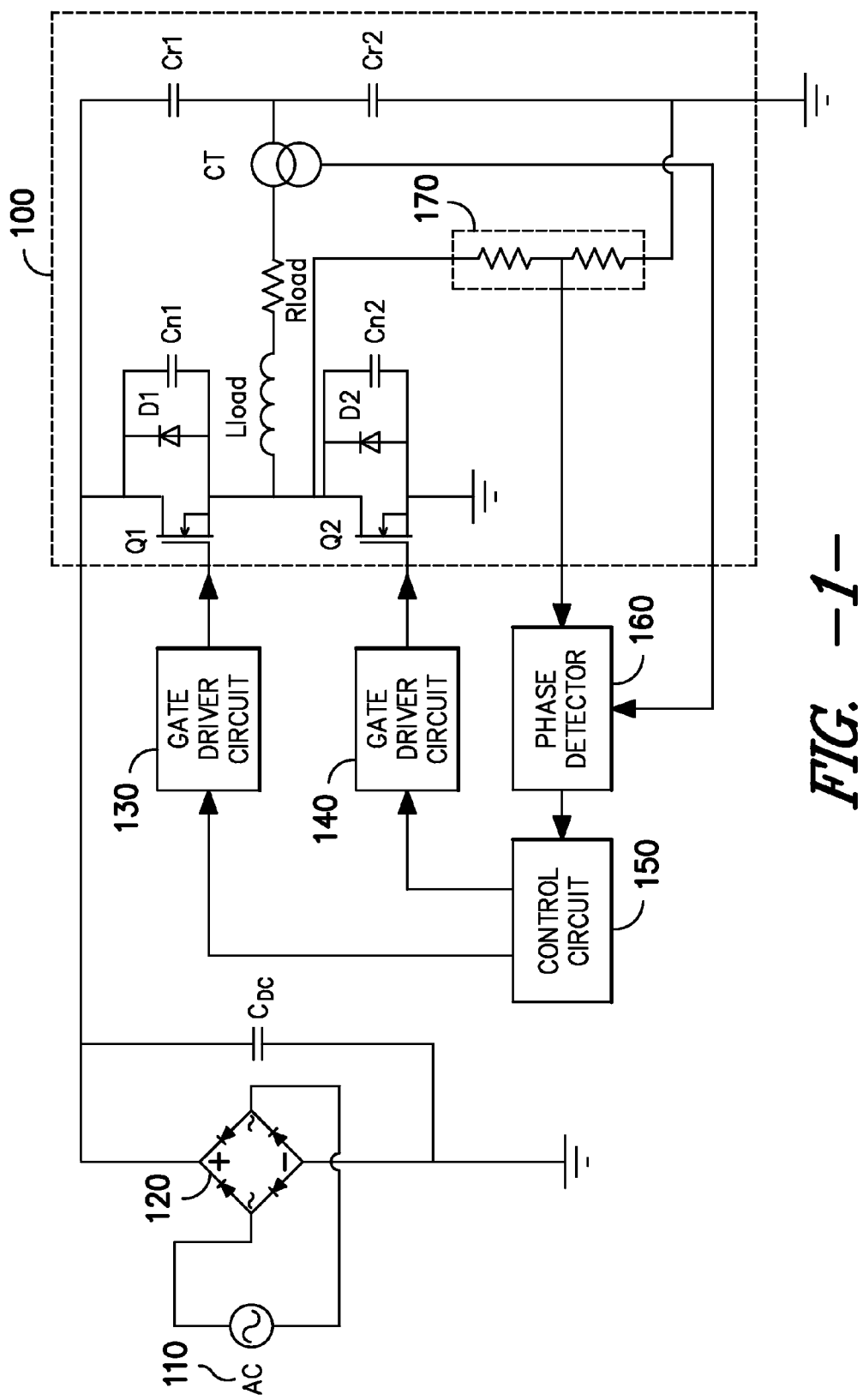
FIG. -1-

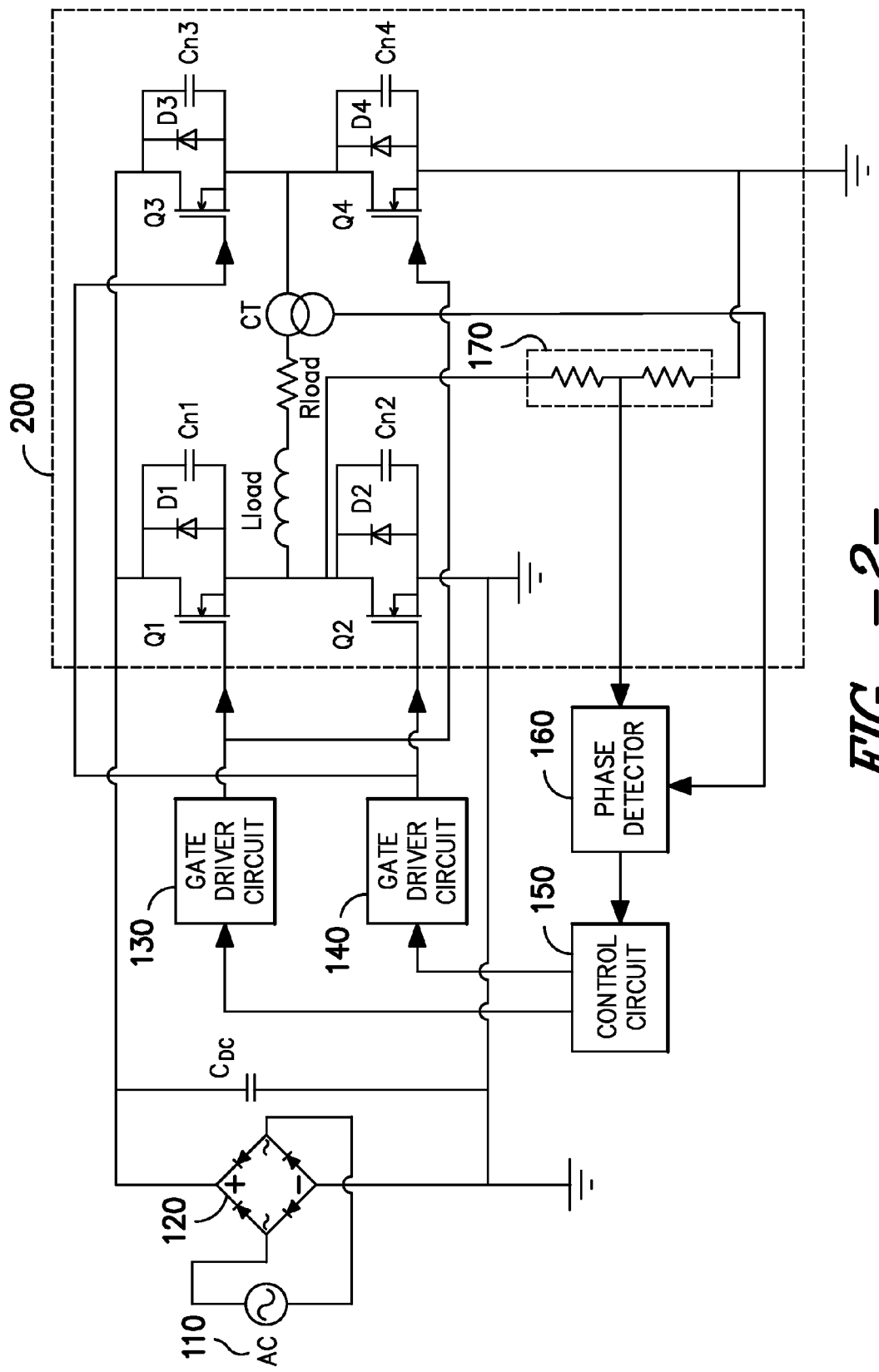
FIG. -2-

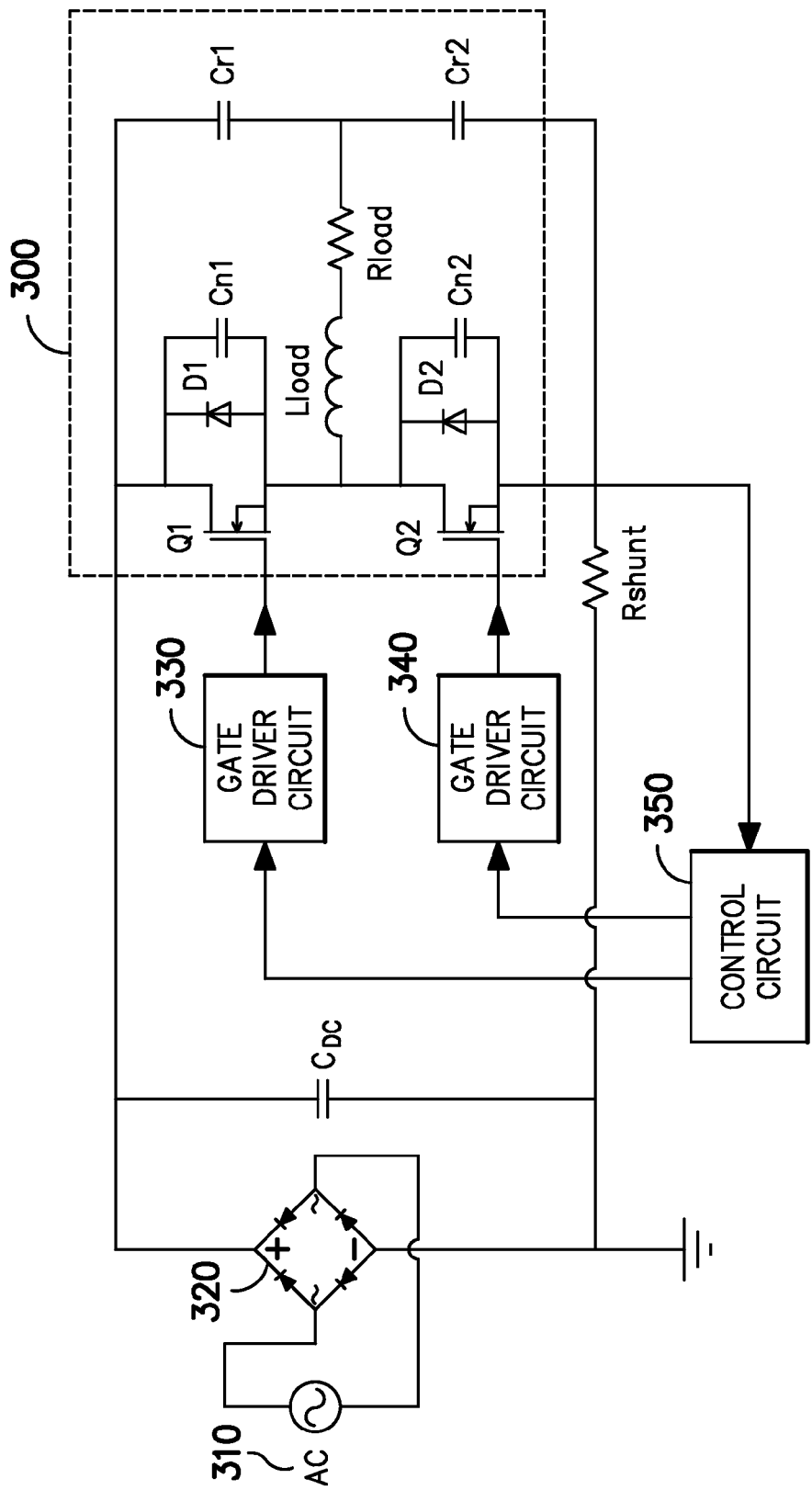
FIG. -3-

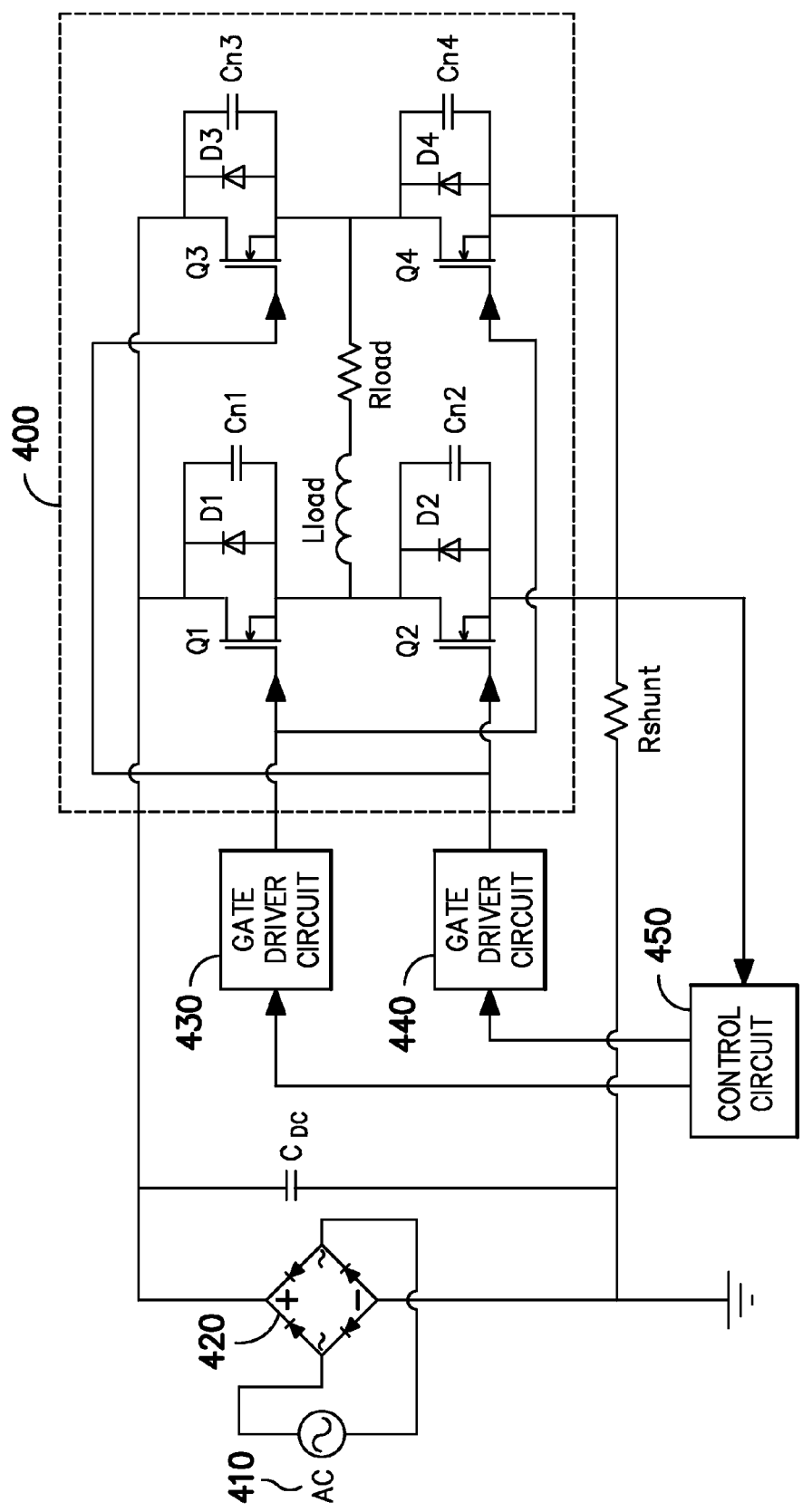
FIG. -4-

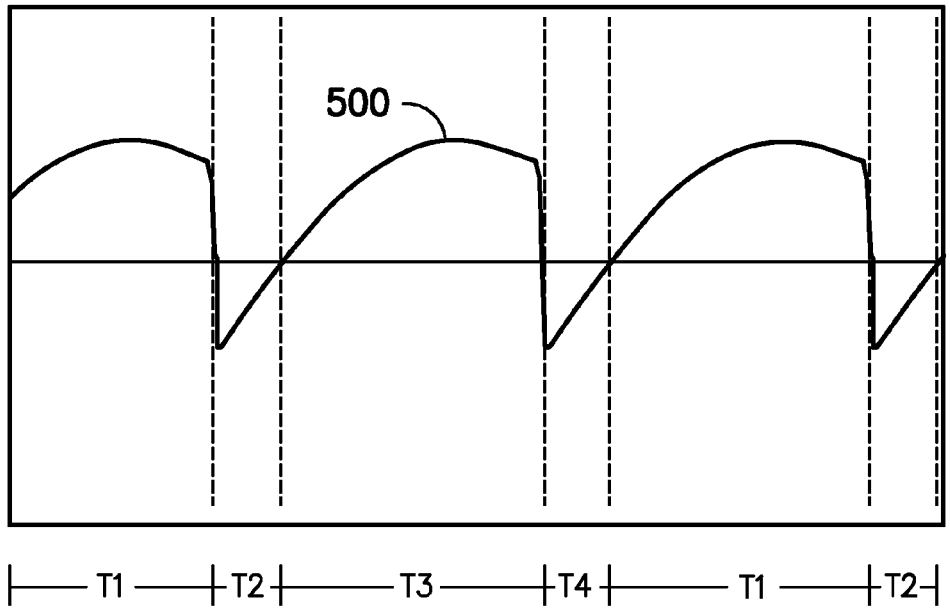
FIG. -5-
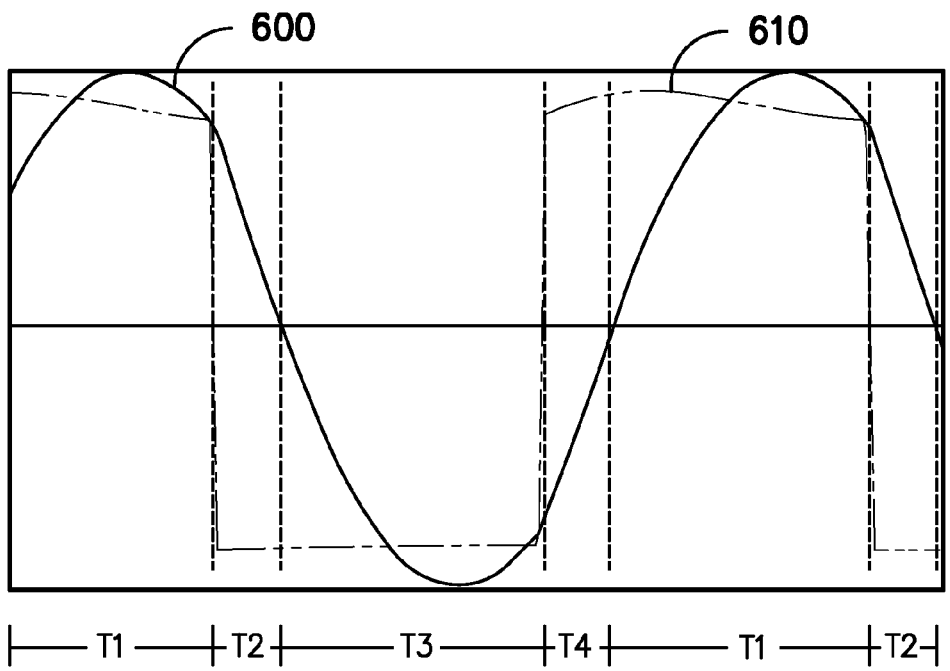
- - - - LOAD VOLTAGE
——— LOAD CURRENT
FIG. -6-

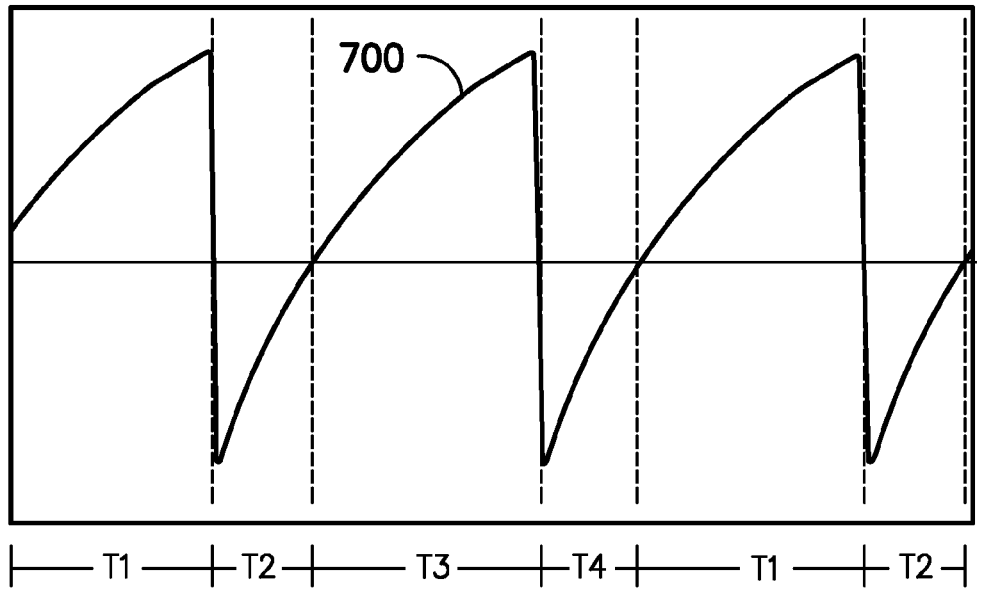
FIG. -7-
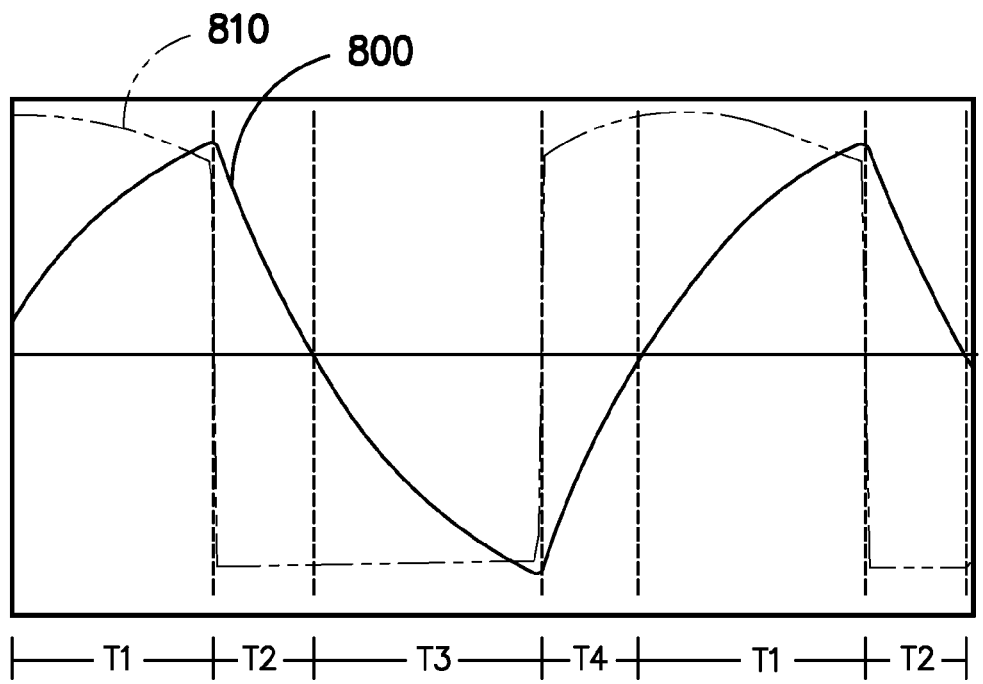
---- LOAD VOLTAGE
—— LOAD CURRENT
FIG. -8-

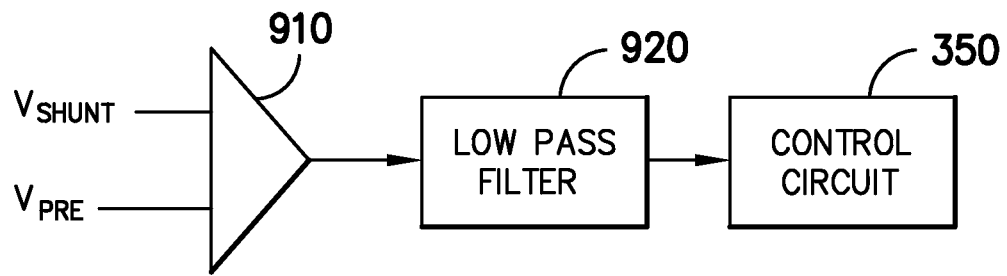
FIG. -9-
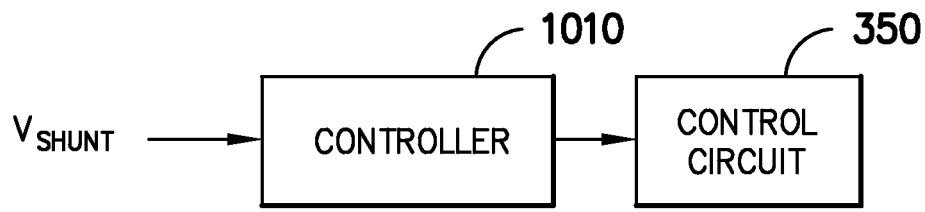
FIG. -10-

PHASE ANGLE DETECTION IN AN INVERTER

FIELD OF THE INVENTION

The present disclosure relates to phase angle detection in an inverter and more particularly to a method for using a detected phase angle as a control signal for power delivery.

BACKGROUND OF THE INVENTION

An inverter is an electrical device that may be used as a power converter in a device such as an appliance. Including elements such as switching elements, diodes, capacitors and control circuits, inverters may be used in various applications such as an appliance having a motor or an induction cooking apparatus. For example, in an appliance having a motor, the speed of the motor may be controlled by the inverter output. In an induction cooking apparatus, an inverter may be used to supply a high-frequency current to a coil in order to create induction heating for cooking.

There are numerous types of inverters including a half-bridge inverter, a full bridge inverter, and a polyphase inverter. In conventional inverter applications, the phase difference between the load current and the load voltage in the circuit is often needed in order to calculate output power.

A typical half-bridge inverter is illustrated in FIG. 1. As shown, power is supplied to a load $L_{load}$, $R_{load}$ through an inverter 100. The inverter is generally configured to generate high frequency power from a DC or rectified AC power supply 110 at the required operating frequency of the load $L_{load}$, $R_{load}$. The load may be an induction coil, motor, or any other inductive load.

The inverter 100 is coupled to an AC source 110, for example a typical 120V power source, that supplies an AC signal to DC rectifier 120. The AC signal is transmitted to capacitor $C_{DC}$. Capacitor $C_{DC}$ may act as a filter to prevent high frequency current from flowing towards the inverter and from entering the input. In addition, it provides a free-wheel path of high frequency current when an inductive load power is flowing back to the source side, for example when a motor is braking.

Inverter 100 may include switching devices Q1 and Q2, which provide power to the load $L_{load}$, $R_{load}$. The direction of the current flowing through the load $L_{load}$, $R_{load}$ may be controlled by the switching of switching devices Q1, Q2. Gate driver circuits 130 and 140 provide switching timing of the switching devices Q1, Q2 based on a switching control signal provided from control circuit 150.

Switching devices Q1, Q2 may be insulated-gate bipolar transistors (IGBTs) or any other switching device. Snubber capacitors Cn1, Cn2 and capacitors Cr1, Cr2 are connected between a positive power terminal and a negative power terminal of switching devices Q1, Q2. Diodes D1, D2 are connected in parallel with switching devices Q1, Q2 and used as free-wheeling diodes. For example, diodes D1, D2 may eliminate a sudden voltage spike across the load $L_{load}$, $R_{load}$ when the voltage is suddenly removed during a switching period.

A typical full-bridge inverter is illustrated in FIG. 2. A full-bridge inverter 200 may have many of the same elements as a half-bridge inverter and are identified with the same reference numbers. In addition to switching devices Q1 and Q2, a full-bridge inverter includes switching devices Q3 and Q4. Snubber capacitors Cn3, Cn4 may be connected between a positive power terminal and a negative power terminal of switching devices Q3, Q4. Diodes D3, D4 are also connected in parallel with switching devices Q3, Q4.

In typical applications, it may be important to monitor both the current and voltage load of the inverter system to determine phase difference between the current and voltage loads in order to provide feedback to adjust the power delivered to the load. In FIGS. 1 and 2, a current transformer CT may be used to measure the load current and the voltage across voltage divider 170 may be used in the load voltage measurement. The load current and voltage measurements are input into phase detector 160 to determine a phase difference. Phase detector 160 produces an output to the control circuit 150 proportional to the phase difference.

However, traditional phase angle measurements require both a load voltage value and a load current value. In addition, current transducers and voltage dividers may provide an inconsistent and inaccurate output due to nonlinear and phase shifting characteristics. Accordingly, output to the control circuit is inaccurate and causes inefficiencies within the inverter circuit.

Thus, a need exists for a system and method for phase angle detection that may be directly derived from a voltage detected across a shunt resistor. A system and method that could use a phase angle based on a directly detected voltage measurement to determine power delivery from an inverter would also be particularly useful.

BRIEF DESCRIPTION OF THE INVENTION

Aspects and advantages of the invention will be set forth in part in the following description, or may be obvious from the description, or may be learned through practice of the invention.

In one exemplary embodiment, the present invention provides a method for detecting phase angle in an inverter, including detecting a shunt resistor voltage and determining a phase angle between a load current and a load voltage based on the detected shunt voltage.

In another exemplary embodiment, the present invention provides an inverter system, including an inverter having a plurality of switching elements, a controller configured to actuate the plurality of switching elements, a shunt resistor coupled to the inverter and the controller, and a sensor coupled to the shunt resistor and the controller. The controller may detect a shunt voltage and determine a phase angle between a load current and a load voltage based on the detected shunt voltage.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 provides a circuit diagram of a typical known half-bridge inverter system.

FIG. 2 provides a circuit diagram of a typical known full-bridge inverter system.

FIG. 3 provides a circuit diagram of a half-bridge inverter system according to an exemplary embodiment of the present disclosure.

FIG. 4 provides a circuit diagram of a full-bridge inverter system according to an exemplary embodiment of the present disclosure.

FIG. 5 provides a graphical depiction of a voltage measurement across a shunt resistor $R_{shunt}$ in an exemplary half-bridge inverter system.

FIG. 6 provides a graphical depiction of the voltage and current across the load in an exemplary half-bridge inverter system.

FIG. 7 provides a graphical depiction of a voltage measurement across a across a shunt resistor $R_{shunt}$ in an exemplary full-bridge inverter system.

FIG. 8 provides a graphical depiction of the voltage and current across the load in an exemplary half-bridge inverter system.

FIG. 9 provides a block diagram of an inverter system according to an exemplary embodiment of the disclosure.

FIG. 10 provides a block diagram of an inverter system according to an exemplary embodiment of the disclosure.

DETAILED DESCRIPTION OF THE INVENTION

The present invention relates to a system and method of detecting phase angle in an inverter. A shunt resistor is coupled to a controller which is part of an inverter circuit and a phase angle may be directly derived from the detected voltage across the shunt resistor. The detected shunt voltage may be used to adjust the power delivery from the inverter to the load.

Reference now will be made in detail to embodiments of the invention, one or more examples of which are illustrated in the drawings. Each example is provided by way of explanation of the invention, not a limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

FIG. 3 is a circuit diagram of an inverter system according to an exemplary embodiment of the present disclosure. The inverter system includes an alternating current (AC) power supply 310, a DC rectifier 320, a capacitor $C_{DC}$ and a half-bridge inverter 300.

The half-bridge inverter may include switching devices Q1 and Q2 which may alternately provide power to the load, $L_{load}$ and $R_{load}$. Switching devices Q1 and Q2 can be insulated-gate bipolar transistors (IGBTs) or any other type of switching device. A diode D1, D2 and a snubber capacitor Cn1, Cn2 may be connected in parallel with each switching device Q1 and Q2, respectively. Diodes D1 and D2 may be free-wheeling diodes. In addition, capacitors Cr1 and Cr2 are connected between a positive power terminal and a negative power terminal of switching devices Q1 and Q2, respectively. Gate driver circuits 330 and 340 may control the direction of the current flowing through $L_{load}$ and $R_{load}$ based on the activation of switching devices Q1 and Q2. Control circuit 350 may provide timing signals to the gate driver circuits 330 and 340 to drive switching devices Q1 and Q2 during a switching period. Gate driver circuits 330 and 340 can be Pulse Width Modulation controlled gate driver integrated circuits or other driving means. Shunt resistor $R_{shunt}$ may be coupled to the half-bridge inverter and a voltage measurement across the shunt resistor $R_{shunt}$ may be used by control circuit 350 in determining a phase angle, where the phase angle is between load current and load voltage.

FIG. 4 is a circuit diagram of an inverter system according to an exemplary embodiment of the present disclosure. The inverter system in FIG. 4 includes an alternating current (AC) power supply 410, a DC rectifier 420, a capacitor $C_{DC}$, control circuit 450 and a full-bridge inverter 400. Full-bridge inverter 400 may have many of the same elements as half-bridge inverter 300 and are identified with the same reference numbers. In addition to switching devices Q1 and Q2, full-bridge inverter 400 may include switching devices Q3 and Q4. Snubber capacitors Cn3 and Cn4 and diodes D3 and D4 may be connected between a positive power terminal and a negative power terminal of switching devices Q3 and Q4, respectively.

While half-bridge and full-bridge inverter systems have been described, one of ordinary skill would recognize that any inverter system may be coupled to a shunt resistor, as described. An alternative inverter system may include a polyphase inverter.

A phase angle or phase difference measurement may represent the difference between two waveforms having the same frequency measured at the same point in time. In measuring phase angle, numerous properties may be determined about the load such as the load magnitude, load position, load slip, or load torque. Phase angle may be determined based on the following equation:

$$\text{Phase angle} = 180° \times \frac{T2}{T2 + T3} = 180° \times \text{duty cycle}$$

where, T1, T2, T3 and T4 are time periods within a switching period and T1=T3 and T2=T4 (see FIGS. 5 and 7).

In an exemplary embodiment shown in FIG. 6, a phase angle measurement may be determined based on the difference between the load current waveform 600 and load voltage waveform 610. When load voltage and load current is conducted through the inverter 300, a voltage may be created across shunt resistor $R_{shunt}$ as represented by waveform 500 in FIG. 5. The phase angle measurement may be determined during time periods T2 and/or T4 based on the directly detected shunt resistor voltage $V_{SHUNT}$.

An exemplary switching period of half-bridge inverter 300 will be described according to an exemplary embodiment of the present disclosure. During the switching period, switching devices Q1 and Q2 may be alternately actuated to provide power to the load $L_{load}$, $R_{load}$.

During time period T1, Q1 is actuated and Q2 is open. This allows the load current ($I_{Load}$) to conduct through Q1, the load $L_{load}$, $R_{load}$ and capacitor Cr2 before reaching the shunt resistor $R_{shunt}$. When the load current ($I_{Load}$) conducts through the shunt resistor $R_{shunt}$, a positive voltage $+V_{SHUNT}$ may be created across the shunt resistor as shown in FIG. 5.

At time period T2, Q1 is opened, Q2 remains open and diode D2 acts as a conductor for the load current ($I_{Load}$) through the load $L_{load}$ and $R_{load}$. When Q1 is opened, current no longer is conducted via Q1 through the previously created current path and a new path is created via D2. More specifically, the shunt resistor current ($I_{shunt}$) reverses direction and load current ($I_{Load}$) continues to pass through $L_{load}$ and capacitor Cr1. As shunt current ($I_{Shunt}$) reverses direction, the voltage across the shunt resistor $R_{shunt}$ may be reversed to a negative voltage ($-V_{SHUNT}$) as shown in FIG. 5 or it may be negative as compared to a reference voltage.

In addition, there may be a spike in voltage across the inductive load $L_{load}$, $R_{load}$ due to the sudden change in load current ($I_{Load}$) direction. However, one of ordinary skill would recognize that due to the inherent properties of an inductor, when switching device Q1 is opened or off, the load current ($I_{Load}$) within the inductive load $L_{load}$ does not equal zero immediately. This may cause the load current ($I_{Load}$) to lag the load voltage, as shown in FIG. 6. During this time period (T2), the current may conduct through diode D2 until the load current ($I_{Load}$) reaches zero.

After the load current ($I_{Load}$) reaches zero, Q2 is actuated and Q1 remains open during time period T3. The current path may conduct through the load $L_{load}$, $R_{load}$ in an opposite direction. More specifically, the load current ($I_{Load}$) may conduct from ground through Cr1, $R_{load}$, $L_{load}$, and switching device Q2 before conducting through shunt resistor $R_{shunt}$ and creating a positive voltage across the shunt resistor $+V_{SHUNT}$, as shown in FIG. 5.

During time period T4, both Q1 and Q2 are open and the load current ($I_{Load}$) may be conducted through diode D1. Again the current path changes so that the load current ($I_{Load}$) through the shunt resistor $R_{shunt}$ reverses, but continues in the same path through capacitor Cr2 and load $R_{load}$, $L_{load}$, causing a negative voltage across the shunt resistor $-V_{SHUNT}$, as shown in FIG. 5.

An exemplary switching period of full-bridge inverter 400 will be described according to an exemplary embodiment of the present disclosure. During the switching period, switching devices Q1, Q4 and Q2, Q3 may be alternately actuated to provide power to the load $L_{load}$, $R_{load}$. The shunt voltage waveform 700 is illustrated in FIG. 7 and the load current waveform 800 and load voltage waveform 810 are illustrated in FIG. 8.

During time period T1, Q1 and Q4 are actuated and Q2 and Q3 are open. This allows the load current ($I_{Load}$) to conduct through Q1, the load $L_{load}$, $R_{load}$ and Q4 before reaching the shunt resistor $R_{shunt}$. When the load current ($I_{Load}$) conducts through the shunt resistor $R_{shunt}$, a positive voltage $+V_{SHUNT}$ may be created across the shunt resistor as shown in FIG. 7.

At time period T2, all switching devices Q1, Q2, Q3 and Q4 are opened, and diodes D2 and D3 act as conductors for the load current ($I_{Load}$) through the load $L_{load}$ and $R_{load}$. Shunt current ($I_{Shunt}$) reverses direction through the shunt resistor $R_{shunt}$ and the load current ($I_{Load}$) conducts through the load $L_{load}$ and $R_{load}$ in the same direction. As the shunt current ($I_{Shunt}$) reverses direction, the voltage across the shunt resistor $R_{shunt}$ may be reversed to a negative voltage $-V_{SHUNT}$, as shown in FIG. 7.

Switching devices Q2 and Q3 are actuated and Q1 and Q4 remain open during time period T3. The current path may conduct through the load $L_{load}$, $R_{load}$ in an opposite direction. More specifically, the load current ($I_{Load}$) may conduct from Q3, $R_{load}$, $L_{load}$, and switching device Q2 before conducting through shunt resistor $R_{shunt}$, creating a positive voltage across the shunt resistor $+V_{SHUNT}$, as shown in FIG. 7.

During time period T4, all switching devices Q1, Q2, Q3, and Q4 are open and the load current ($I_{Load}$) may be conducted through diodes D1 and D4. Again the current path is the same in the load, but the current reverses through the shunt resistor $R_{shunt}$, causing a negative voltage across the shunt resistor $-V_{SHUNT}$, as shown in FIG. 7.

The phase angle may be determined in an inverter system by directly detecting the voltage across the shunt resistor $R_{shunt}$ during time periods T2 and T4. The control circuit 450 may detect the shunt resistor voltage $V_{SHUNT}$ or a separate device may be used. After the shunt resistor voltage $V_{SHUNT}$ is detected, the control circuit 450 may provide a signal to gate driver circuits 430 and 440 based on the determined phase angle.

In one exemplary embodiment, a comparator may be used to determine the phase angle. As shown in FIG. 9, the detected shunt resistor voltage $V_{SHUNT}$ and a predetermined voltage $V_{PRE}$ are inputs to a comparator 910. The predetermined voltage $V_{PRE}$ may be an offset voltage equal to the load voltage value or another known voltage value such as a voltage value relating to the duty cycle, or phase of the load. When shunt resistor voltage $V_{SHUNT}$ is above voltage $V_{PRE}$, this time may relate to the duty cycle, which may relate to the phase of the load. The comparator 910 may compare the input shunt resistor voltage $V_{SHUNT}$ with the predetermined voltage $V_{PRE}$ input over time periods T1, T2, T3 and T4. When the shunt resistor voltage is greater than the predetermined voltage ($V_{SHUNT}>V_{PRE}$) the output of the comparator 910 is high and when the shunt resistor voltage is less than the predetermined voltage ($V_{SHUNT}<V_{PRE}$) the output is low. In other words, the comparator output signal may be a pulse width modulated signal having a duty cycle, where the duty cycle may represent the phase angle. For example, if the output signal is high for ten (10) seconds and low for ninety (90) seconds, an output signal having a duty cycle of 10/100 is provided. The phase angle may be calculated from a signal having a duty cycle as follows:

$$\text{Phase angle}=180°\times\text{duty cycle}=180°\times.01=18 \text{ degrees}$$

The output of comparator 910 may be input into a low pass filter 920. Low pass filter 920 may convert the pulse width modulated output signal into a constant output that can be proportional to the duty cycle of the pulse width modulated signal. The low pass filter 920 output may be coupled with control circuit 350 to provide a signal that may be used to control the inverter system.

In another exemplary embodiment, a controller may be used to determine the phase angle. As illustrated in FIG. 10, the detected shunt resistor voltage $V_{SHUNT}$ is input into controller 1010. Controller 1010 may be a microcontroller analog-to-digital converter or any other controller device. The controller may include a memory and microprocessor, CPU or the like, such as a general or special purpose microprocessor operable to execute programming instructions or microcontrol code associated with an inverter system within an appliance. The memory may represent random access memory such as DRAM, or read only memory such as ROM or FLASH. In one embodiment, the processor executes programming instructions stored in memory. The memory may be a separate component from the processor or may be included onboard within the processor.

The controller 1010 may compare the shunt resistor voltage $V_{SHUNT}$ of a predetermined voltage value $V_{PRE}$. Alternatively, the shunt resistor voltage $V_{SHUNT}$ may be assigned a numerical value and that value may be compared to another predetermined numerical value. When the shunt resistor voltage is greater than the predetermined voltage ($V_{SHUNT}>V_{PRE}$), the controller 1010 assigns a first value to the result and when the shunt resistor voltage is less than the predetermined voltage ($V_{SHUNT}<V_{PRE}$), the controller 1010 assigns a second value to the result. The first and second values may accrue over a predetermined time period where the ratio of first values over the total number of values within the predetermined time period may be determined to be a duty cycle. After determining the duty cycle, controller 1010 may calculate a phase angle, as discussed above.

The exemplary embodiments described above may be used in any appliance that includes an inverter. For example, in an induction cooking appliance, load $L_{load}$, $R_{load}$ may be an induction coil and the inverter system may be a power source used to energize the coil. When a phase angle is determined in an induction cooking apparatus it may represent various conditions within the system, such as the presence of a pan on the cooktop, a type of pan material and whether the pan material is adequately conductive within the system and the placement or displacement of the pan in relation to the coil.

In another example, the exemplary inverter system may be included within an appliance that includes a motor such as a washing machine, garbage disposal or compressor. When a phase angle is determined within an appliance having a motor, the phase angle may be used to calculate the torque of the motor, where the torque calculation is used during the control operation of the appliance.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for detecting phase difference in an inverter, comprising:
    detecting a voltage of a waveform across a shunt resistor;
    determining a first duration of a first period of time for which the voltage of the waveform across the shunt resistor is less than an offset voltage;
    determining a second duration of a second period of time for which the voltage of the waveform across the shunt resistor is greater than the offset voltage; and
    determining a phase difference between a load current and a load voltage based at least in part on a duty cycle indicative of a ratio of the first duration to a sum of the first duration and the second duration;
    wherein the first period of time and the second period of time together comprise a half-cycle of the waveform across the shunt resistor.

2. The method as in claim 1, further comprising controlling the inverter based on the phase difference.

3. The method as in claim 1, wherein a comparator is used in determining the phase difference and the detected voltage of the waveform across the shunt resistor and the offset voltage are inputs to the comparator.

4. The method as in claim 3, wherein an output of the comparator is connected to a controller, wherein the output of the comparator includes a signal that exhibits the duty cycle.

5. The method as in claim 1, wherein the inverter is included in an induction cooking apparatus.

6. The method as in claim 5, wherein the phase difference is used to determine at least one of a presence of a pan, type of pan material and pan placement on a burner.

7. The method as in claim 1, wherein the inverter is included in an apparatus having a motor.

8. The method as in claim 7, wherein the apparatus is at least one of a washing machine, a garbage disposal, and a compressor.

9. The method as in claim 7, further comprising calculating torque of the motor based on the phase angle.

10. The method of claim 1, wherein the offset voltage comprises zero.

11. An inverter system, comprising:
    an inverter having a plurality of switching elements;
    a shunt resistor coupled to said inverter;
    a comparator, wherein the comparator receives as inputs an offset voltage and a voltage of a waveform across the shunt resistor, and wherein an output signal of the comparator exhibits a duty cycle that is indicative of a ratio of a first duration to a sum of the first duration and a second duration; and
    a controller configured to determine a phase difference between a load current and a load voltage based at least in part on the duty cycle of the output signal of the comparator;
    wherein the first duration comprises a first amount of time for which the voltage of the waveform across the shunt resistor is less than the offset voltage and the second duration comprises a second amount of time for which the voltage of the waveform across the shunt resistor is greater than the offset voltage; and
    wherein the first duration and the second duration together comprise a half-cycle of the waveform across the shunt resistor.

12. The inverter system as in claim 11, wherein said controller further calculates an output power of said inverter system and actuates or adjusts actuation of the plurality of switching elements based on the phase difference.

13. The inverter system as in claim 11, wherein said inverter system is included in an induction cooking apparatus.

14. The inverter system as in claim 13, wherein the phase difference is used to determine at least one of a presence of a pan, type of pan material and a pan placement on burner.

15. The inverter system as in claim 11, wherein said inverter system is included in an apparatus having a motor.

16. The inverter system as in claim 15, wherein the apparatus is at least one of a washing machine, a garbage disposal, and a compressor.

17. The inverter system as in claim 15, wherein the controller is further configured to calculate torque of the motor based on the phase difference.

18. The system of claim 11, wherein the offset voltage comprises zero.

19. The system of claim 11, further comprising a low pass filter coupled between the comparator and the controller, wherein the low pass filter converts the duty cycle of the output signal of the comparator into a constant output that is proportional to the duty cycle.

20. The system of claim 11, wherein the shunt resistor is positioned between the inverter and a ground.

* * * * *